(12) United States Patent
Jo

(10) Patent No.: US 12,288,648 B2
(45) Date of Patent: Apr. 29, 2025

(54) METHOD OF MANUFACTURING A TRENCH CAPACITOR WITH WAFER BOW

(71) Applicant: SK keyfoundry Inc., Cheongju-si (KR)

(72) Inventor: Seung Mo Jo, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

(21) Appl. No.: 18/677,991

(22) Filed: May 30, 2024

(65) Prior Publication Data

US 2024/0312725 A1  Sep. 19, 2024

Related U.S. Application Data

(62) Division of application No. 17/568,908, filed on Jan. 5, 2022, now Pat. No. 12,033,806.

(30) Foreign Application Priority Data

Jul. 9, 2021 (KR) .......................... 10-2021-0090132

(51) Int. Cl.
| | | |
|---|---|---|
| H01L 23/64 | (2006.01) | |
| H01G 4/33 | (2006.01) | |
| H01G 4/35 | (2006.01) | |
| H10D 1/00 | (2025.01) | |
| H10D 1/68 | (2025.01) | |

(52) U.S. Cl.
CPC ............. *H01G 4/35* (2013.01); *H01L 23/642* (2013.01); *H10D 1/692* (2025.01)

(58) Field of Classification Search
CPC .......... H01L 23/642; H01G 4/33; H01G 4/35; H01G 4/385; H01G 4/1263; H10D 1/684; H10D 1/692
See application file for complete search history.

(56) References Cited

U.S. PATENT DOCUMENTS

| | | | |
|---|---|---|---|
| 8,283,750 B2 | 10/2012 | Guiraud et al. | |
| 2016/0020267 A1* | 1/2016 | Lin | ........................ H01L 28/91 257/532 |

(Continued)

FOREIGN PATENT DOCUMENTS

KR    10-2008-0043139 A    5/2008

OTHER PUBLICATIONS

Bunel, C., et al. "Integrated Passive Devices and TSV, a disruptive technology for miniaturization." International Symposium on Microelectronics. vol. 2013. No. 1. International Microelectronics Assembly and Packaging Society, 2013. (pp. 1-5).

(Continued)

*Primary Examiner* — Omar F Mojaddedi
(74) *Attorney, Agent, or Firm* — NSIP Law

(57) ABSTRACT

A trench capacitor manufacturing method is provided. The method includes forming a deep trench in a wafer, forming a trench capacitor structure including a plurality of dielectric films and a plurality of conductive layers in the deep trench; determining if the wafer has a tensile stress based on the forming of the trench capacitor structure; performing a high temperature heat treatment to the trench capacitor structure to change a form of the wafer to a direction that offsets the tensile stress; forming an inter-layer insulating film on the trench capacitor structure; and forming a metal interconnect on the inter-layer insulating film.

11 Claims, 17 Drawing Sheets

(56) References Cited

U.S. PATENT DOCUMENTS

| | | | |
|---|---|---|---|
| 2016/0064519 A1 | 3/2016 | Yang et al. | |
| 2019/0088717 A1* | 3/2019 | Yeh et al. | |
| 2020/0066445 A1* | 2/2020 | Nakagawa | H01L 29/945 |
| 2020/0161415 A1* | 5/2020 | Jia | H01L 23/562 |
| 2020/0176552 A1* | 6/2020 | Chang | H01L 28/91 |
| 2021/0027950 A1* | 1/2021 | Nakagawa | H01G 4/018 |
| 2021/0343881 A1* | 11/2021 | Cheng | H01L 28/91 |

OTHER PUBLICATIONS

Hwang, W.S., et al., "The effect of process variations and post thermal annealing on the properties of LPCVD polycrystalline silicon" Journal of the Korean Vacuum Society, vol. 11, No. 4, 2002. (pp. 225-229). (Abstract in English, 5 pages in Korean).

Korean Office Action issued on Jun. 15, 2023, corresponds in Korean Patent Application No. 10-2021-0090132 A (5 pages in English, 5 pages in Korean).

Korean Office Action issued on Dec. 20, 2023, corresponds in Korean Patent Application No. 10-2021-0090132 A (5 pages in English, 5 pages in Korean).

* cited by examiner

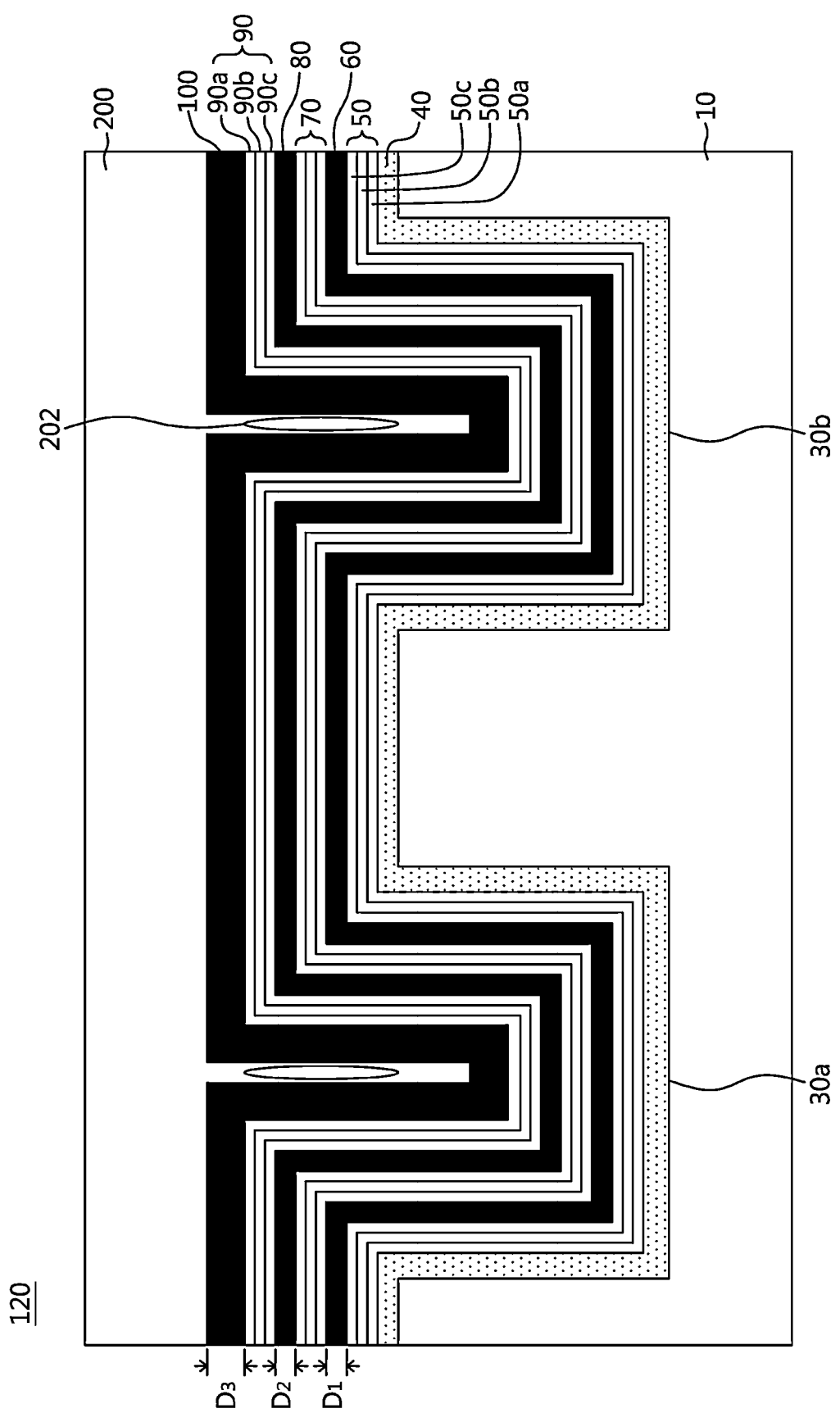

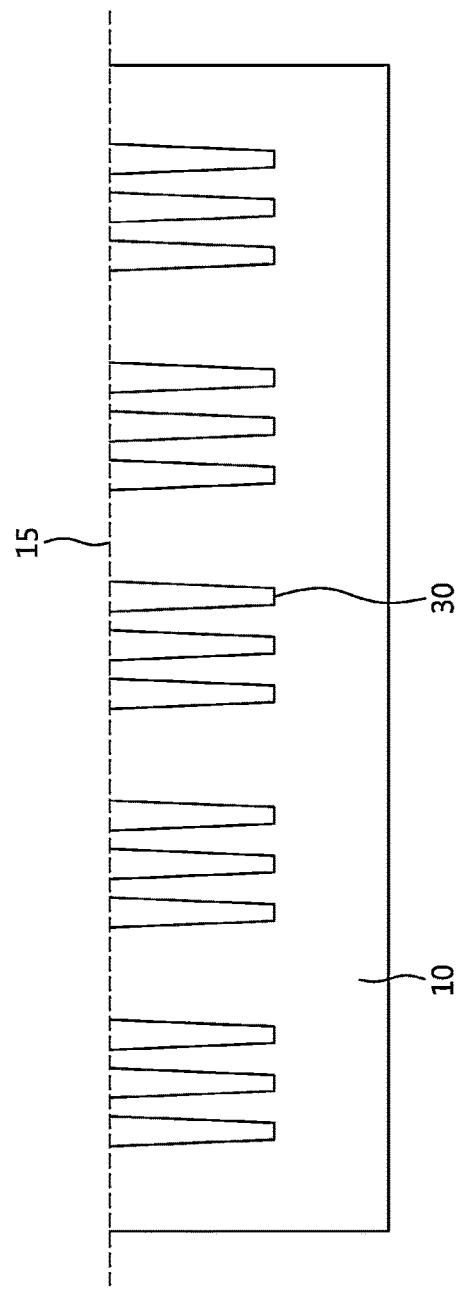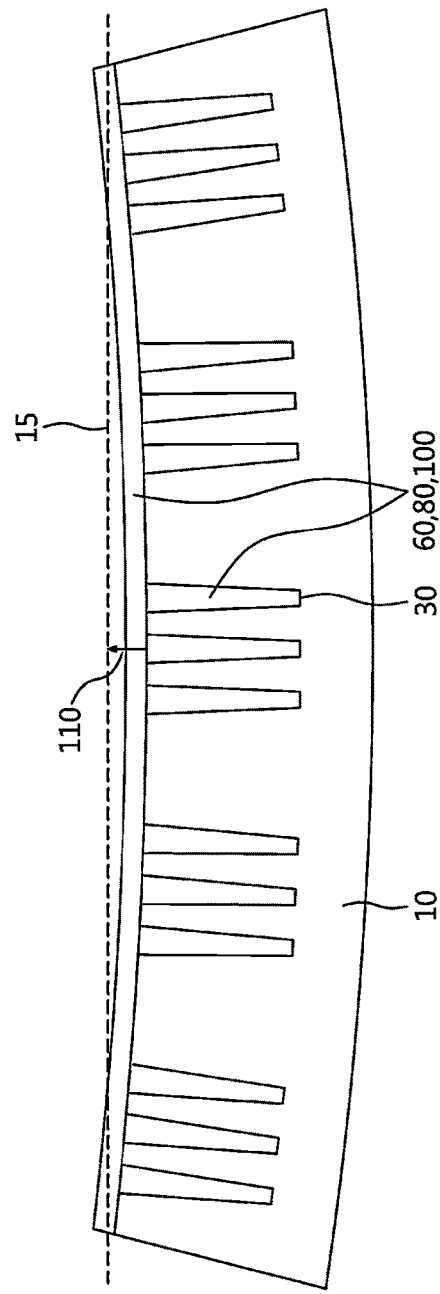

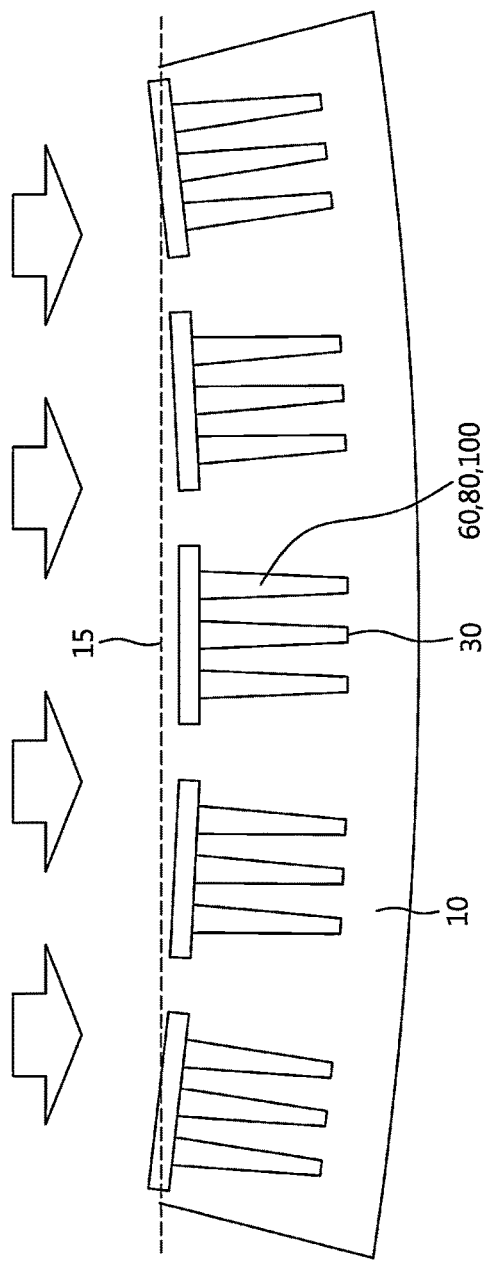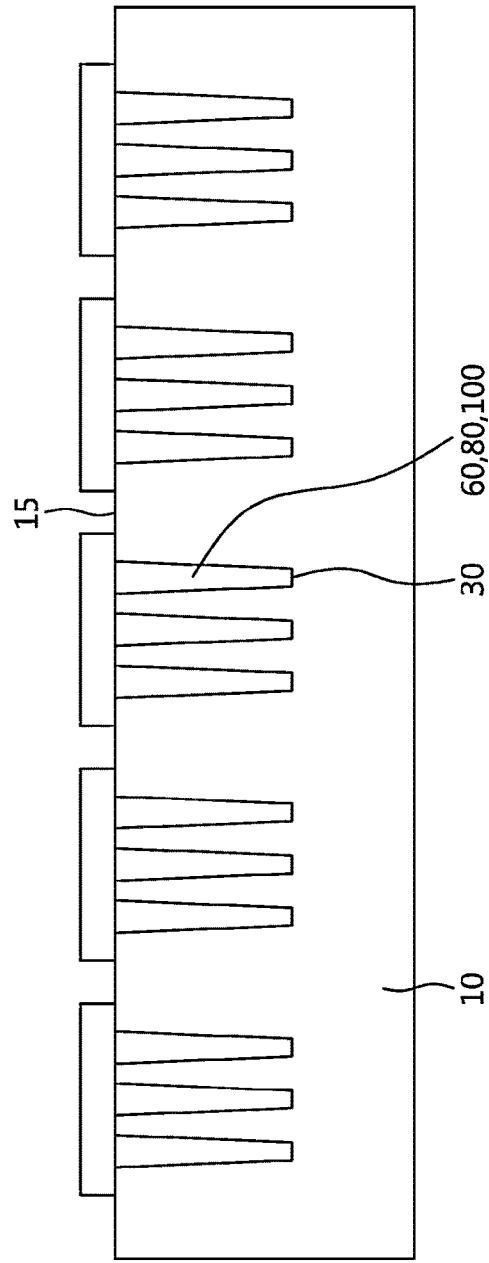

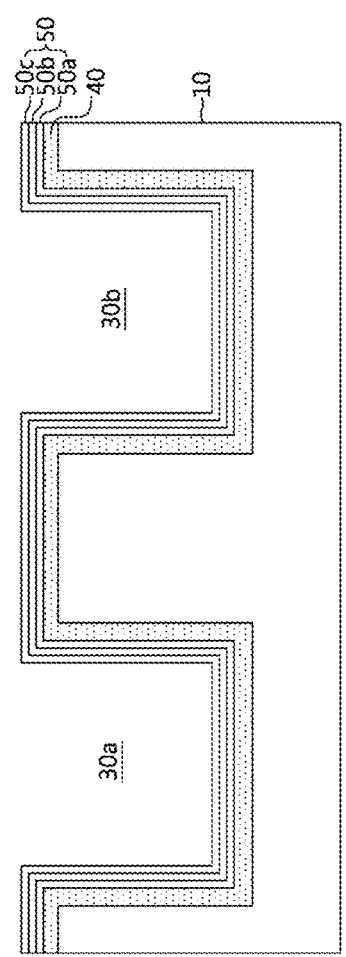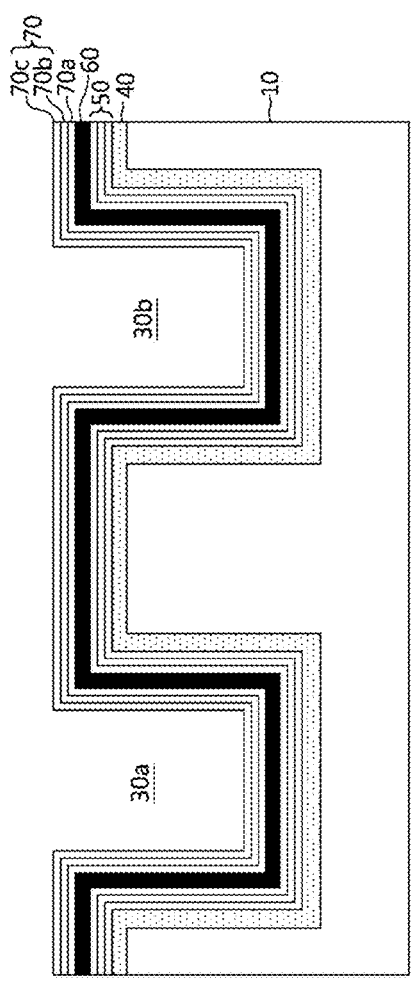

METHOD OF MANUFACTURING A TRENCH CAPACITOR WITH WAFER BOW

CROSS-REFERENCE TO RELATED APPLICATION(S)

This is a divisional application of U.S. application Ser. No. 17/568,908 filed on Jan. 5, 2022 which claims the benefit under 35 U.S.C. § 119 of Korean Patent Application No. 10-2021-0090132 filed on Jul. 9, 2021, in the Korean Intellectual Property Office, the entire disclosure of which is incorporated herein by reference for all purposes.

BACKGROUND

1. Field

The following description relates to a method of manufacturing a trench capacitor with a wafer bow.

2. Description of Related Art

A trench capacitor structure may be formed with a trench formed in a vertical direction in a semiconductor substrate. The trench capacitor structure may increase a capacity of a capacitor as a depth of a trench deepens.

A deposition procedure to stack three conductive layers may be implemented as a method to manufacture a trench capacitor with a high capacity. However, typically, when a gap-filling process is conducted with a conductive layer and an insulating film inside a trench, a wafer itself may be warped because of the stress of utilizing different materials. The deeper the depth of a trench is, the more intensified the problem becomes, therefore, it is beneficial to prevent increasing a capacity of a trench capacitor relatively.

Additionally, when a wafer is warped, it becomes difficult to chuck a wafer to a wafer chuck, therefore, a subsequent process such as a photo lithography process or an etching process may not be performed stably.

The above information is presented as background information only to assist with an understanding of the present disclosure. No determination has been made, and no assertion is made, as to whether any of the above might be applicable as prior art with regard to the disclosure.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a deep trench capacitor includes one or more deep trenches disposed in a substrate; a first dielectric film disposed in the one or more deep trenches; a first conductive layer disposed on the first dielectric film; a second dielectric film disposed on the first conductive layer; a second conductive layer disposed on the second dielectric film; a third dielectric film disposed on the second conductive layer; a third conductive layer disposed on the third dielectric film; and an inter-layer insulating film disposed on the third conductive layer, wherein the third conductive layer is configured to be thicker than the first conductive layer or the second conductive layer.

The third conductive layer may be disposed inside the one or more deep trenches, and a void or an air-space is disposed adjacent to the third conductive layer.

The first conductive layer and the third conductive layer may be electrically connected to each other, and the second conductive layer and the substrate are electrically connected to each other.

The deep trench capacitor may include a doping region disposed under the first dielectric film.

The third conductive layer may have a thickness that is greater than a sum of a thickness of the first conductive layer and a thickness of the second conductive layer.

The first dielectric film, the second dielectric film, or the third dielectric film respectively may include a first oxide layer, a nitride layer and a second oxide layer, and the first dielectric film, the second dielectric film, or the third dielectric film respectively may include a Poly-Si material.

The first conductive layer, the second conductive layer, and the third conductive layer respectively may have a first cross-sectional area, a second cross-sectional area, and a third cross-sectional area in a plan view, and the first cross-sectional area may be greater than the second cross-sectional area, and the second cross-sectional area is greater than the third cross-sectional area in the plan view.

In a general aspect, a trench capacitor manufacturing method includes forming a deep trench in a wafer; depositing a plurality of dielectric films and a plurality of conductive layers in the deep trench; patterning the plurality of dielectric films and the plurality of conductive layers; performing a high temperature heat treatment to the wafer comprising the patterned plurality of dielectric films and the patterned plurality of conductive layers; forming an inter-layer insulating film on the wafer; and forming a metal interconnect on the formed inter-layer insulating film.

The high temperature heat treatment may change the plurality of conductive layers from an amorphous phase to a crystalline phase.

The depositing of the plurality of dielectric films and the plurality of conductive layers may provide a tensile stress to the wafer.

The high temperature heat treatment may be performed for a period of 10 minutes to 60 minutes at a temperature of 1000° C.-1200° C.

The wafer may be configured to have a tensile stress before the performing of the high temperature heat treatment, and the tensile stress may be offset after the performing of the high temperature heat treatment.

In a general aspect, a trench capacitor manufacturing method includes forming a plurality of trench structures in a doping region of a substrate; depositing a plurality of conductive layers and a plurality of insulating films into the plurality of trench structures to provide a tensile stress to the substrate; and performing a high temperature heat treatment to the substrate to change the tensile stress to a compressive stress.

The changing of the tensile stress may include changing an amorphous conducting layer having a tensile stress to a crystalline conductive layer having a compressive stress.

The high temperature heat treatment may be performed at a temperature of 1000° C.-1200° C.

The method may include conducting the high temperature heat treatment for a period of 10 minutes to 60 minutes.

The changing of the tensile stress may include changing a shape of the substrate to a shape that offsets a direction of the tensile stress.

Other features and aspects will be apparent from the following detailed description, the drawings, and the claims.

BRIEF DESCRIPTION OF DRAWINGS

FIG. 1 illustrates an example structure of an example trench capacitor, in accordance with one or more embodiments.

FIGS. 2A-2D illustrate an example method of manufacturing an example trench capacitor, in accordance with one or more embodiments.

FIGS. 6 to 15 illustrate an example method of manufacturing an example trench capacitor, in accordance with one or more embodiments.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 3:
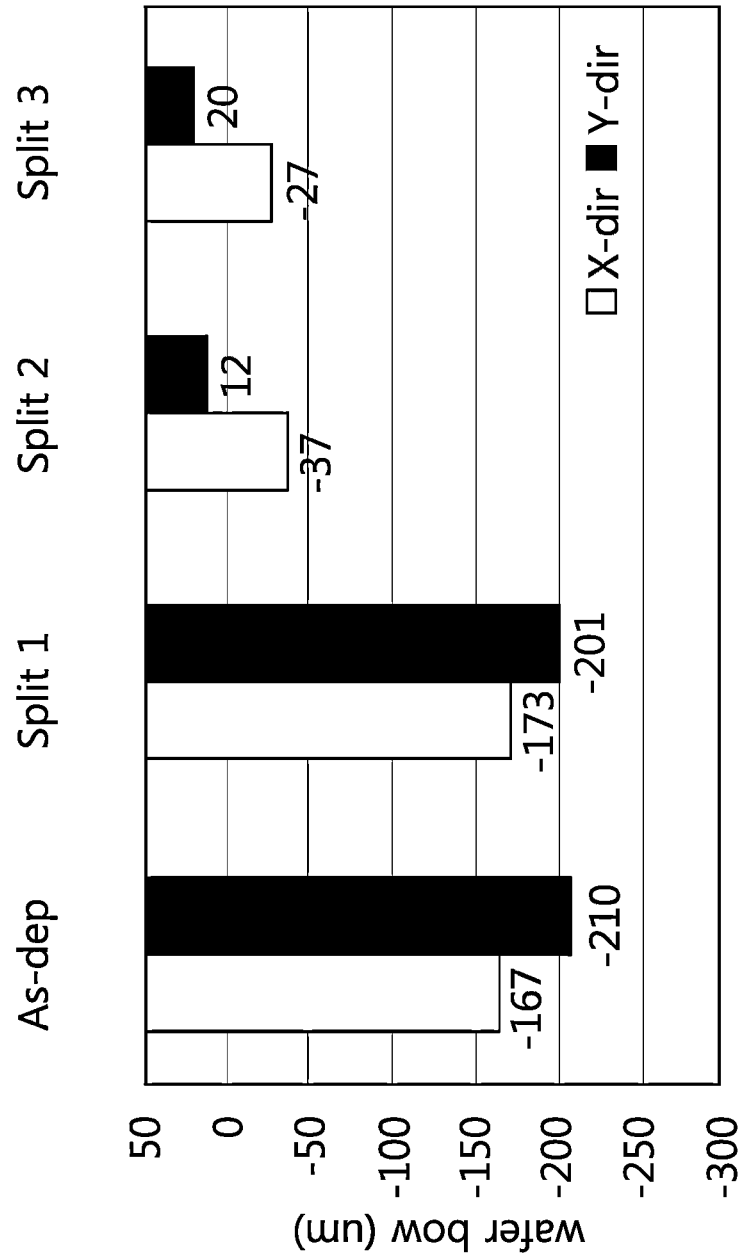
FIG. 3 illustrates an effect of thermal treatment on warpage of an example wafer, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The disclosure is to prevent a warpage of a wafer and to manufacture a trench capacitor applied a deep trench with a high capacity.

The disclosure may also perform a following process stably after a depositing process inside a deep trench.

A detailed description for the disclosure is given below, based on embodiments shown in drawings.

FIG. 1 illustrates an example structure of an example trench capacitor, in accordance with one or more embodiments.

Referring to FIG. 1, a trench capacitor 120 may comprise a doping region 40 disposed in a semiconductor substrate 10, and a first deep trench 30a and a second deep trench 30b disposed in the doping region 40. The trench capacitor 120 may further comprise at least a first dielectric film 50, a first conductive layer 60, a second dielectric film 70, a second conductive layer 80, a third dielectric film 90, and a third conductive layer 100 disposed in the respective first and second deep trenches 30a and 30b. The trench capacitor 120 may further comprise a gap-fill insulating film 200 filled inside the first deep trench 30a and the second deep trench 30b. When the gap-fill insulating film 200 is stacked, a void or an air-space 202 may be formed inside the trenches 30a and 30b according to a depositing method. This is because a top surface of the third conductive layer 100 may be sealed before a bottom surface of the third conductive layer 100, since a gap of the third conductive layer 100 may be narrow.

In the one or more examples, the semiconductor substrate 10 may refer to a substrate of a wafer. The doping region 40 may be implemented as a lower electrode of the trench capacitor 120. In a non-limiting example, each width of the first and second deep trenches 30a and 30b may be about 1~3 μm, and a depth of the first and second deep trenches 30a and 30b may be 50~100 μm. A trench capacitor with a high capacity may be manufactured by forming such deep trenches 30a and 30b. Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The respective first, second and third dielectric films 50, 70 and 90 may be implemented as a dielectric layer of the trench capacitor 120. The first dielectric film 50 may be a structure which stacks a plurality of dielectric films 50a, 50b, and 50c. In a non-limiting example, a first dielectric film 50 may be formed with an oxide layer 50a—a nitride layer 50b—an oxide layer 50c. In an example, three insulating films of a thermal oxide (a first oxide layer), a nitride layer, and a second oxide layer may be sequentially formed. In an example, a first oxide layer 50a and a second oxide layer 50c may be formed with a same material. However, a nitride layer 50b may be formed with a completely different material from the first oxide layer 50a and the second oxide layer 50c. Such an example structure of the first dielectric film 50 may be the same as a structure of a second dielectric film 70 and a structure of the third dielectric film 90. In an example, a thickness of the first dielectric film 50 may be about 10-100 nm.

Referring to FIG. 1, the first, second and third conductive layers 60, 80 and 100 may be formed using a doped poly-silicon. However, the examples are not limited thereto. Respective first to third conductive layers 60, 80, and 100 may be stacked with a different thickness. In an example, a first conductive layer 60, a second conductive layer 80 and a third conductive layer 100 may have respectively first, second and third thicknesses, D1, D2 and D3. In an example, the first thickness, D1 may be almost the same as the second thickness, D2. However, the third thickness, D3 may be greater than the first thickness D1 or the second thickness D2.

In an example, a thickness (D1) of the first conductive layer 60 and a thickness (D2) of the second conductive layer 80) may be respectively 100-300 nm, and a thickness (D3) of the third conductive layer 100 may be 300-800 nm. The third conductive layer 100 may be formed to be thicker than a sum (D1+D2) of a thickness (D1) of the first conductive layer 60 and a thickness (D2) of the second conductive layer 80. The reason why a thickness of the first conductive layer 60 and a thickness of the second conductive layer 80 may be smaller than a thickness of the third conductive layer 100 is to decrease a level of stress. The thinner a thickness of the first conductive layer 60 and the second conductive layer 80 is, the more a warpage of a wafer is improved. However, when a thickness of the first conductive layer 60 and the second conductive layer 80 becomes too thin, a trench gap may be created, therefore, an optimal thickness may be beneficial.

Since a plurality of dielectric films and conductive layers may be deposited by a CVD method, the dielectric films and conductive layers may be formed to face each other from each side wall of the first and second deep trenches 30a and 30b. Thus, when a plurality of dielectric films and conductive layers are shown based on a center line of a trench, the plurality of dielectric films and conductive layers may have a symmetrical structure.

The plurality of dielectric films 50, 70 and 90 and conductive layers 60, 80 and 100 may face each other in a middle area. As the third conductive layer 100 is deposited on both sides of the deep trenches 30a and 30b, the third conductive layer 100 may meet each other in a middle area of the deep trenches 30a and 30b. Each of the first and second deep trenches 30a and 30b may be filled by the gap-fill insulating film 200, thus eliminating a void or an air-space 202. If the third conductive layer 100 does not meet each other in a middle area, a void or an air-space 202 may be created between the third conductive layer 100 after performing a gap-fill process as a subsequent process.

Herein, a warpage of the wafer 10 may occur when the plurality of conductive layers 60, 80, and 100 are filled in each of the first and second deep trenches 30a and 30b.

FIGS. 2A-2D illustrate an example method of manufacturing an example trench capacitor, in accordance with one or more embodiments.

Referring to FIG. 2A, a doping region (not shown) may be formed in a substrate 10, and a plurality of deep trenches 30 may be formed. Herein, a baseline 15 refers to a surface of a substrate 10. An approximately flat surface may be observed after forming a plurality of deep trenches 30 in the substrate 10. A slight warpage of a wafer may occur after the deep trenches 30 are formed in the semiconductor substrate 10.

FIG. 2B illustrates a warpage of a wafer after a plurality of conductive layers 60, 80, and 100 are formed in the plurality of deep trenches 30. As described earlier, the plurality of dielectric films 50, 70 and 90, and the plurality of conductive layers 60, 80 and 100 may be formed in a deep trench 30. After depositing the plurality of dielectric films 50, 70 and 90, and the plurality of conductive layers 60, 80, and 100 in a deep trench 30, a warpage of the wafer 10 may occur. This warpage may occur because the plurality of dielectric films 50, 70 and 90, and the plurality of conductive layers 60, 80, and 100 may have a tensile stress or a compressive stress. The narrower and deeper a depth of the trench 30 is, the stronger the effect of a stress may be.

When the plurality of conductive layers 60, 80, and 100 formed in the deep trench 30 have a compressive stress, the wafer 10 may be convexly warped. When the wafer 10 is convexly warped, a wafer surface may be formed higher than a baseline 15, therefore, a wafer bow 110 value may be positive.

On the contrary, when the plurality of conductive layers 60, 80, 100 formed in the deep trench 30 have a tensile stress, the wafer 10 may be concavely warped. When the wafer 10 is concavely warped, a wafer surface may be formed lower than a baseline 15, therefore, a wafer bow 110 value may be negative.

In an example, since the plurality of conductive layers 60, 80, and 100 formed in the deep trench 30 may have a tensile stress, the wafer 10 may be concavely warped. Therefore, a surface of a wafer 10 may be located lower than the baseline 15. A wafer bow 110 may occur based on the difference. In this example, a wafer bow value may be negative.

When the wafer bow 110 occurs, problems may occur in subsequent processes. The wafer 10 may be held to a wafer chuck by using a vacuum in a photo or an etching process, and since the wafer 10 is warped, a gap between a wafer chuck and the wafer 10 is created, making it difficult to hold the wafer 10 with a vacuum. When a tensile stress or a compressive stress is intense, a wafer may be broken. In this example, a manufacturing process of a semiconductor device may not be stably performed. Thus, a high temperature heat treatment process is proceeded to solve the problem.

Referring to FIG. 2C, a high temperature heat treatment process may be performed in a warped wafer. When a heat treatment process is performed with a high temperature, a warpage of the wafer 10 may be improved. Therefore, as illustrated in FIG. 2D, a warpage of the wafer 10 is improved, and a surface of the wafer 10 may return to a flat shape.

FIG. 3 illustrates an effect of thermal treatment on warpage of an example wafer according to a condition of a heat treatment, in accordance with one or more embodiments.

Referring to FIG. 3, a wafer bow value according to a condition of a heat treatment is illustrated. 'As-dep' refers to a wafer bow value measured in a state where a conductive layer 60 is filled in a deep trench 30 having a depth of 50~100 μm. In this example, a wafer bow value may be −167 μm, −210 μm. The bigger an absolute value of a wafer bow is, the more intense a warpage of the wafer becomes. Since a deposited conductive layer 60 may have a tensile stress, a wafer bow value may be negative.

A condition 1 of a heat treatment ("Split 1") may refer to an example where a wafer, in which a conductive layer is filled in a trench, is treated by a high temperature heat treatment process at a temperature of 900° C. A bow value of a wafer may be minimally changed even when a high temperature heat treatment process is performed at a temperature of 900° C.

A condition 2 of a heat treatment ("Split 2") may refer to an example in which a wafer, in which a conductive layer 60 is filled in a deep trench 30, is treated by a high temperature heat treatment at a temperature of 1050° C. A condition 3 of a heat treatment ("Split 3") may refer to an example in which a wafer, in which a conductive layer 60 is filled in a deep trench 30, is treated by a high temperature heat treatment at a temperature of 1100° C. In an example of a condition 2 of a heat treatment ("Split 2") and an example of a condition 3 of a heat treatment ("Split 3"), a bow value of a wafer is considerably improved, below −50 μm. Accordingly, a bow phenomenon of a wafer may be differently implemented according to a heat treatment temperature. Accordingly, a temperature may be desirably over 1000° C. to improve a wafer bow or a warpage.

Figure 4:
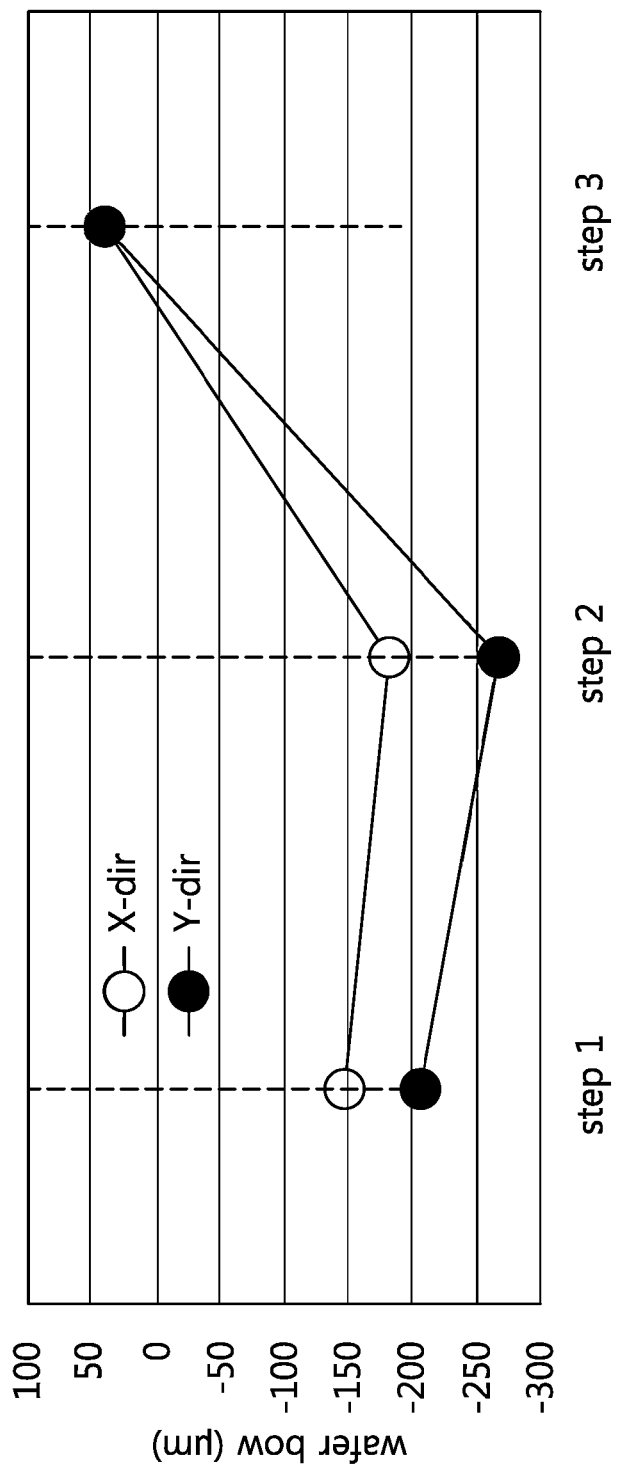
FIG. 4 illustrates an effect of process operation on warpage of a wafer, in accordance with one or more embodiments.

FIG. 4 illustrates an effect of a process operation on warpage of a wafer, in accordance with one or more embodiments.

Referring to FIG. 4, the X-axis refers to a progress of a process, and the Y-axis refers to a wafer bow value with each step of a process. A first step (step 1) is a state in which a first dielectric film 50 and a first conductive layer 60 are deposited in a deep trench 30 having a depth of 50~100 μm. In this example, a wafer bow value may be −140 μm to −210 μm.

The first dielectric film 50 and the first conductive layer 60 formed inside a trench 30 (30a or 30b, for example) may induce a tensile stress to a wafer. Since the first dielectric film 50 and the first conductive layer 60 may be composed of different materials, a tensile stress may be induced. In an example, the first dielectric film 50 may be composed of ONO insulating film, and the first conductive layer 60 may be formed of a poly-silicon. Such tensile stress may cause a warpage of the wafer 10. However, since the first conductive layer 60 may be formed to be thicker than the insulating film, the first conductive layer 60 may have more influence on a warpage of the wafer 10 than the first dielectric film 50.

Referring again to FIG. 4, a second step (step 2) illustrates a wafer bow value measured in an example in which the first dielectric film 50, the first conductive layer 60, the second dielectric film 70, and the second conductive layer 80 are deposited in the deep trench 30. In a second step (step 2), a warpage of the wafer 10 becomes intensified because an absolute value of a wafer bow may be increased. The more the first conductive layer 60 and the second conductive layer 80 are deposited, the larger a tensile stress becomes, and a bow of the wafer 10 may be larger based on the applied tensile stress. Therefore, the more the first, the second, and the third conductive layers 60, 80, and 100 are deposited, the greater a tensile stress becomes, and a bow of the wafer 10 may be larger based on the tensile stress.

Referring again to FIG. 4, a third step (step 3) illustrates an example where a high temperature heat treatment at a temperature of 1150° C. is performed in an example where the first dielectric film 50, the first conductive layer 60, the second dielectric film 70, and the second conductive layer 80 are deposited in the deep trench 30. In this example, a wafer bow value may be positive, under 50 μm. Compared with examples before a high temperature heat treatment process and after a high temperature heat treatment process, a warpage may be considerably improved in both the x-axis direction and the y-axis direction. Before a high temperature heat treatment process, a degree of a warpage is about −150~−300 μm, but after the process, it may be improved to be about under +50 μm.

Figure 5:
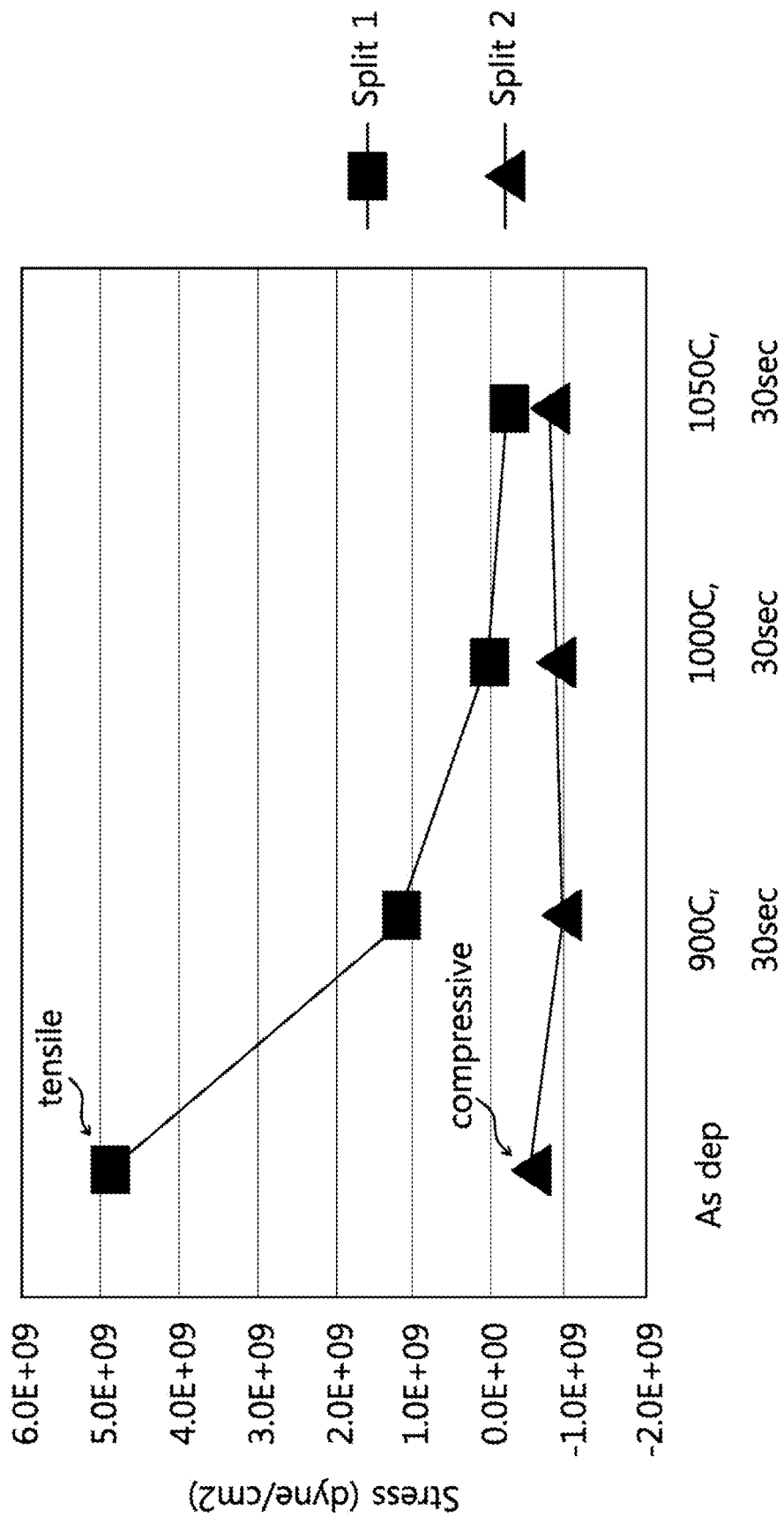
FIG. 5 illustrates a phase of a conductive layer deposited in a deep trench, in accordance with one or more embodiments, and a change of a stress according to a RTP annealing temperature.

FIG. 5 illustrates a phase of a conductive layer deposited in a deep trench, in accordance with one or more embodiments, and a change of a stress according to a Rapid Thermal Process (RTP) annealing temperature.

Referring to FIG. 5, 'Split 1' is an amorphous conductive layer deposited by a Low Pressure Chemical Vapor Deposition (LPCVD) method in a 500-600° C. 'Split 2' is a crystalline conductive layer deposited by a LPCVD method in a 600-700° C. A conductive layer is a poly-silicon. It is a depositing temperature to decide whether a conductive layer is amorphous or crystalline.

A RTP annealing is conducted for 30 seconds at temperatures of 900° C., 1000° C., 1050° C. to each conductive layer having 2 different phases (amorphous and crystalline).

In a stress outcome in the "As-dep" state for a conductive layer deposited in a deep trench, a tensile stress or a compressive stress may be shown according to a phase of a conductive layer.

First, an amorphous conductive layer ("Split 1") deposited at a temperature of 500-600° C. may have a tensile stress. A crystalline conductive layer ("Split 2") deposited at a temperature of 600-700° C. may have a compressive stress. A phase of a conductive layer, amorphous or crystalline, may be discovered by a type of stress that a conductive layer may have. If a conductive layer has a tensile stress, it is highly possible that the conductive layer is amorphous. Additionally, if a conductive layer has a compressive stress, it is highly possible that the conductive layer may be crystalline.

A change of a stress according to a temperature of RTP annealing will now be described.

According to a temperature of RTP annealing, a crystalline conductive layer may continuously have a compressive stress regardless of a temperature. On the other hand, a stress of an amorphous conductive layer may be changed according to a RTP temperature. Thus, when a temperature of a high temperature heat treatment is increased, a conductive layer having a tensile stress may be changed to a conductive layer having a compressive stress. An amorphous conductive layer may be changed to a crystalline conductive layer. That is, a phase of an amorphous conductive layer may be changed from amorphous to crystalline, which may indicate that it is changed from having a tensile stress to having a compressive stress.

As described earlier, a tensile stress may be obtained when a plurality of conductive layers are deposited in the deep trench 30. Thus, a wafer 10 may be warped with a concave shape. However, after a high temperature heat treatment process with 1000-1200° C., an amorphous conductive layer 60, 80, and 100 having a tensile stress may be changed to a crystalline conductive layer 60, 80, and 100 having a compressive stress. Accordingly, on the basis of a high temperature heat treatment process, a wafer that is concavely shaped by a tensile stress may be changed to a convexly shaped wafer. Thus, a tensile stress may be reduced. When a high temperature heat treatment takes too much time, a wafer may become convex again. Therefore, it may be desirable to conduct annealing within a predetermined period of time. In an example, a warpage of a wafer may almost disappear with a heat treatment for 10 to 60 minutes. That is, a tensile stress may be offset by a high temperature heat treatment. Therefore, a warped wafer may become flat again.

FIGS. 6 to 17 are process drawings illustrating a method of manufacturing a trench capacitor, in accordance with one or more embodiments.

Figure 6:
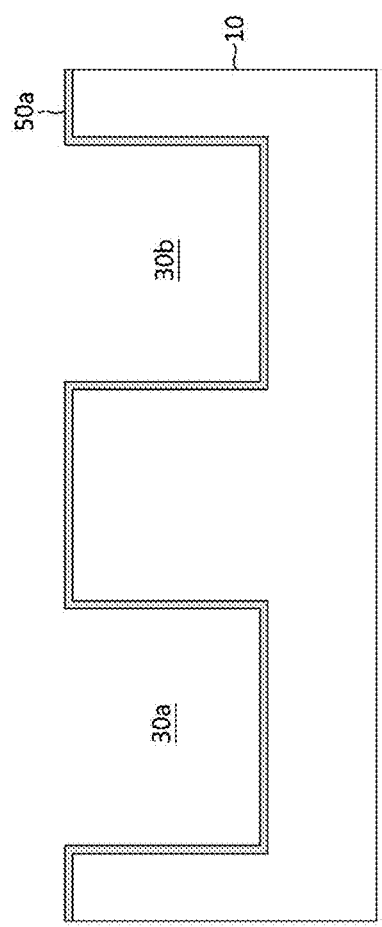

Referring to FIG. 6, as discussed in FIG. 1A, a first deep trench 30a and a second deep trench 30b may be formed in the substrate 10. In the one or more examples, a substrate 10 refers to a wafer. In an example, two deep trenches 30a and 30b may be formed. As mentioned earlier, a depth of a first deep trench 30a and a second deep trench 30b may be about 1~3 μm, and a depth may be 50~100 μm. A trench capacitor with a high capacity may be manufactured by forming such a first deep trench 30a and a second deep trench 30b. A thin oxide layer 50a may be formed on a trench surface by a thermal oxidation method. A thin oxide layer may relieve a stress that is formed when etching a trench, and may remove a defect occurring during an etching process.

Figure 7:
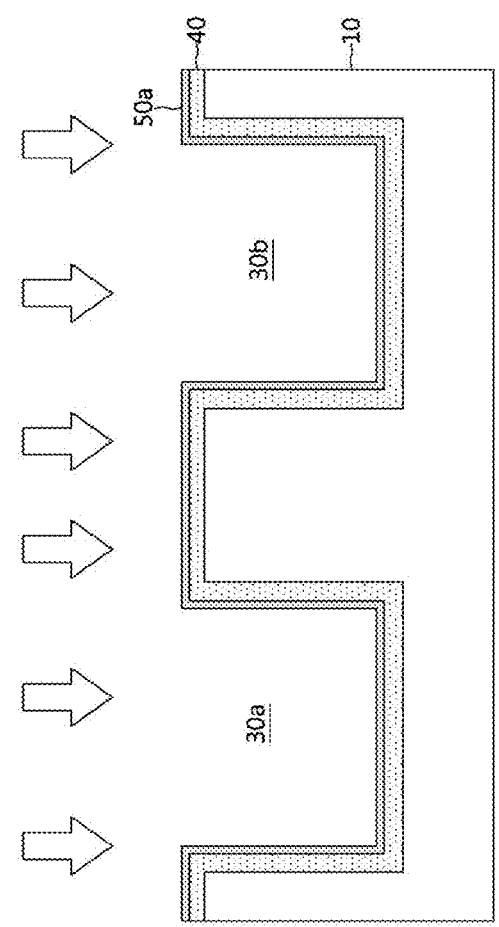

Referring to FIG. 7, in order to reduce a resistance of a semiconductor substrate 10 and high concentration doping, a doping region 40 may be formed by doping with a predetermined thickness by injecting POCl3 gas, including, but not limited to, Phosphors (P) in the substrate 10. The doping region 40 may be formed entirely on a top of the substrate 10 and an inner side of the trench 30a, and the trench 30b. The doping region 40 may be formed under a thin oxide layer 50a. When the substrate 10 is a P-type, the doping region 40 is formed with an N-type. The doping region 40 may be implemented as a lower electrode. Next, a deposition process of an insulating film and a conductive layer may be performed inside a trench 30a or 30b. In the example, a deposition process includes repeatedly stacking an insulating film and a conductive layer, three times. However, this is only an example, and the insulating film and a conductive layer may be repeatedly stacked a different number of times.

Referring to FIG. 8, the first dielectric film 50 may be stacked on the substrate 10 including at least one trench 30a, 30b. The nitride layer 50b and the oxide layer 50c may be sequentially deposited on the oxide layer 50a by a LPCVD method. Thus, the first dielectric film 50 may be a structure which stacks a plurality of dielectric films 50a, 50b, and 50c. In a non-limiting example, the first dielectric film 50 may be formed with an oxide layer 50a—a nitride layer 50b—an oxide layer 50c. In an example, three insulating films of a thermal oxide, (a first oxide layer and a third oxide layer), and a nitride layer, (a second oxide layer) may be sequentially formed. In an example, a first oxide layer 50a and a second oxide layer 50c may be formed with a same material. However, in an example, a nitride layer 50b may be formed with a completely different material from the first oxide layer 50a and the second oxide layer 50c. Such a structure of the first dielectric film 50 may be the same as a structure of the second dielectric film 70 and the third dielectric film 90. In an example, a thickness of the first dielectric film 50 may be about 10-100 nm. Since the first dielectric film 50 is deposited, each space of the first and second deep trenches 30a and 30b may be decreased.

Referring to FIG. 9 the first conductive layer 60 may be formed on the first dielectric film 50 with a predetermined thickness. The first conductive layer 60 may be deposited by, as a non-limiting example, a LPCVD method by using a poly-silicon. As mentioned earlier, a poly-silicon doped by an in-situ doping method at a temperature of 500-600° C. may be deposited. In this example, the first conductive layer 60 in an amorphous phase may be deposited to have a tensile stress. The second dielectric film 70 may be formed on the first conductive layer 60. The second dielectric film 70 may be a structure which stacks a plurality of dielectric films 70a, 70b, and 70c, and the second dielectric film 70 may be formed, as a non-limiting example, with an oxide layer 70a—a nitride layer 70b—an oxide layer 70c.

Figure 10:
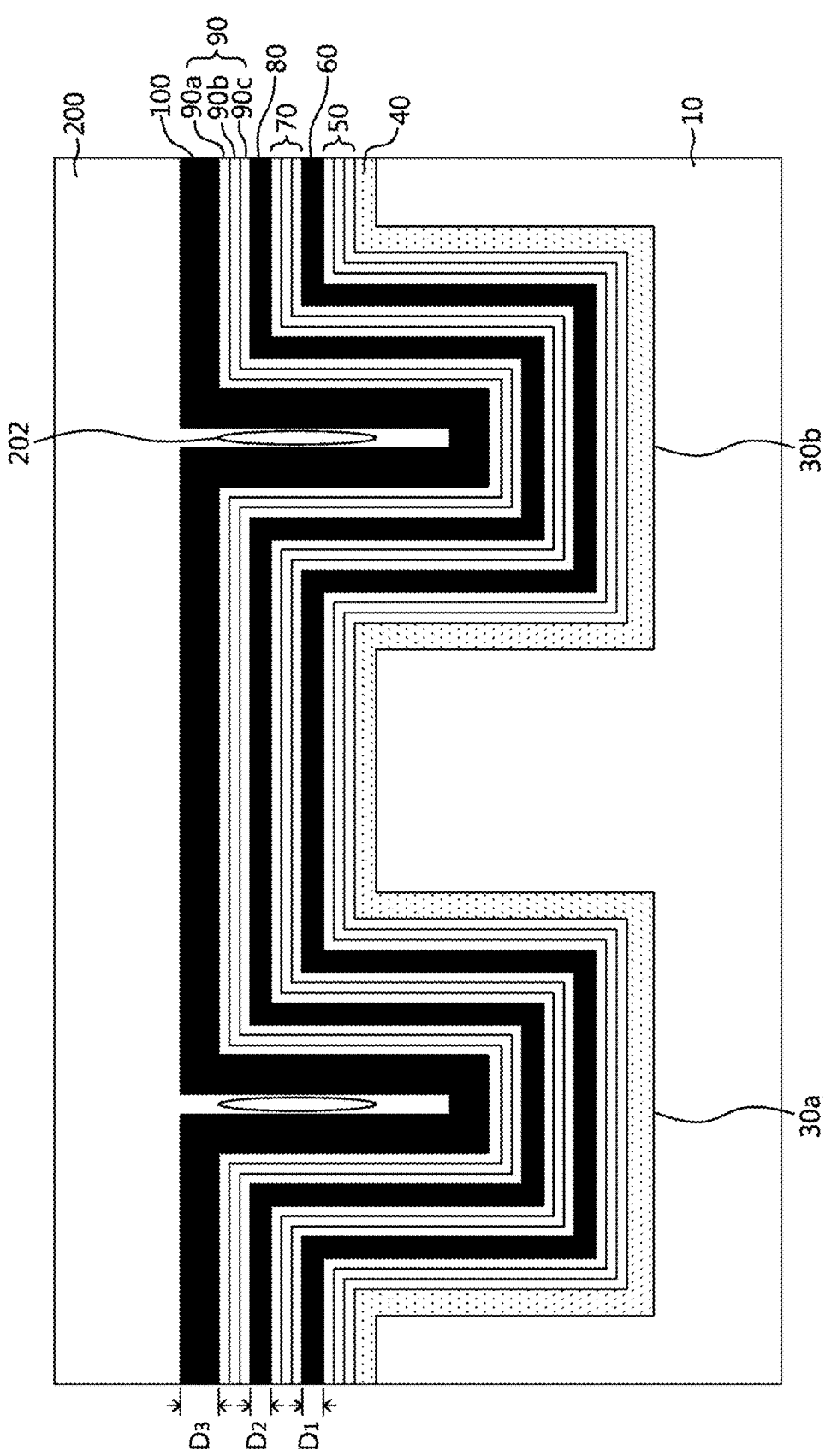

Referring to FIG. 10, the second conductive layer 80 may be formed on the second dielectric film 70. Similar to the first conductive layer 60, a poly-silicon having the same composition may be deposited to form the second conductive layer 80. That is, a poly-silicon doped by an in-situ doping method at temperatures of 500-600° C. may be deposited. In this example, the second conductive layer 80 in an amorphous phase may be deposited to have a tensile stress. The third dielectric film 90 and the third conductive layer 100 may be formed on the second conductive layer 80. The third dielectric film 90 may also be formed with a plurality of dielectric films of, as only examples, an oxide layer 90a, a nitride layer 90b, and an oxide layer 90c. Similar to the respective first or second conductive layers 60 and 80, a poly-silicon having the same composition may be deposited to form the third conductive layer 100. That is, a poly-silicon doped by an in-situ doping method at a temperature of 500-600° C. may be deposited. In this example, a third conductive layer 100 in an amorphous phase may be deposited to have a tensile stress. Therefore, for a first, a second, and a third conductive layer, a doped, amorphous conductive layer may be formed. Conductive layers 60, 80, and 100, all having a tensile stress, may be deposited in a deep trench 30 having 50-100 μm depth. As mentioned earlier, a wafer may be concavely warped in this state.

After depositing a third conductive layer 100, the gap-fill insulating film 200 with a predetermined thickness may be stacked to implement a gap-fill process and a patterning process of a conductive layer, for example, the third conductive layer 100. A gap-fill process, which is a process wherein respective first to third conductive layers 60, 80, and 100, and a gap-fill insulating film 200 may be filled inside the trench 30a and the trench 30b according to such a process, is completed. When the gap-fill insulating film 200 is stacked, a void or an air-space 202 may be formed inside trenches 30a and 30b according to a depositing method. This is because a top surface of the third conductive layer 100 may be sealed before a bottom surface of the third conductive layer 100, since a gap of the third conductive layer may be narrow.

Figure 11:
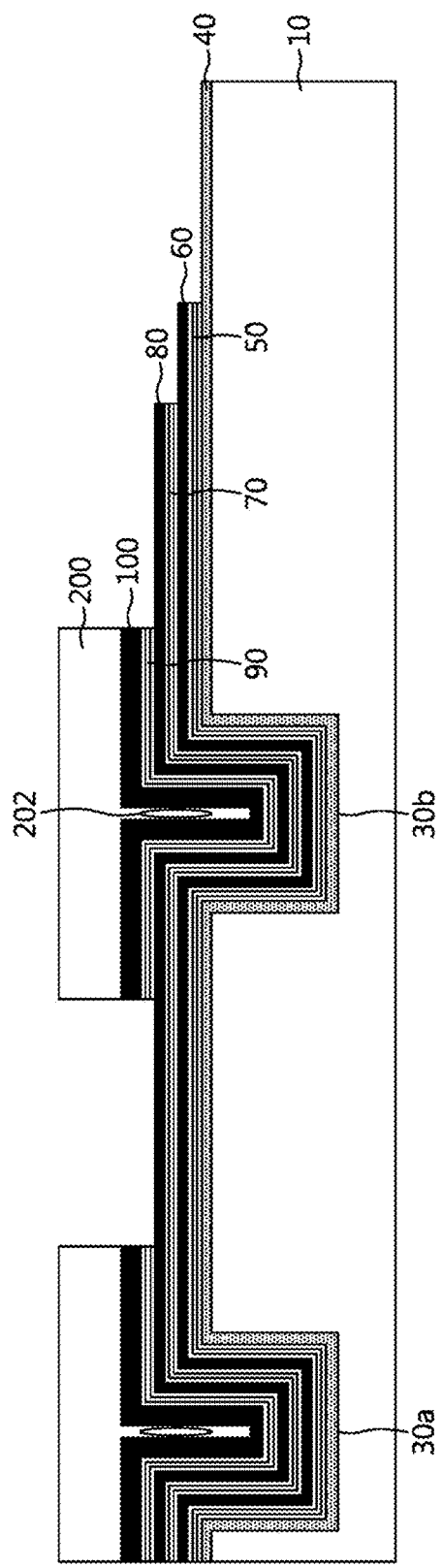

Referring to FIG. 11, a plurality of patterning processes is performed to form the patterned gap-fill insulating film 200, the patterned third conductive layer 100 and the patterned third dielectric film 90, the patterned second conductive layer 80 and the patterned second dielectric film 70, the patterned first conductive layer 60, and the patterned first dielectric film 50 on the doping region 40 using a photoresist pattern or a hard mask pattern (not shown). Each side surface of the patterned gap-fill insulating film 200, the patterned third conductive layer 100 and the patterned third dielectric film 90, the patterned second conductive layer 80 and the patterned second dielectric film 70, the patterned first conductive layer 60 and the patterned first dielectric film 50a may be exposed by the patterning processes.

After performing the patterning processes, a top surface of the substrate 10 or the doping region 40 may be exposed. When a process of patterning the respective first to third conductive layers 60, 80, and 100 is completed, a length of the first conductive layer 60 may be formed to be the longest, and a length of the third conductive layer 100 may be formed to be the shortest.

After performing the patterning processes, a re-oxidation process may be performed to the respective first to third conductive layers 60, 80, and 100 at a temperature of about 700-950° C. under an oxygen atmosphere. A re-oxidation process may oxidize a side surface of the respective first, second, and third conductive layers 60, 80, and 100. Accordingly, any damages that may occur during the patterning of the respective first, second, and third conductive layers 60, 80, and 100, may be eliminated.

Figure 12:
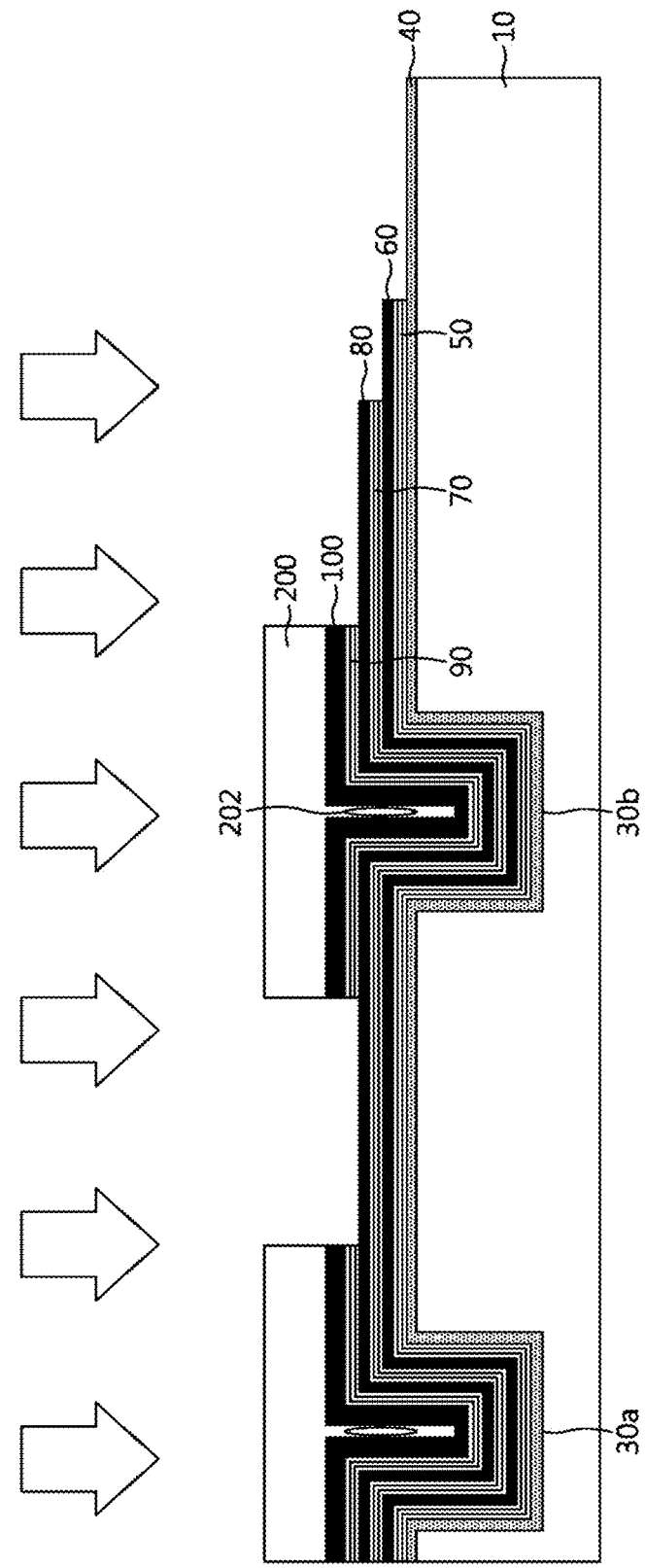

Referring to FIG. 12, a high temperature heat treatment process may be performed to an entire wafer including a substrate 10 at a high temperature of 950-1200° C. under a nitrogen atmosphere. In the examples, a warpage of a wafer may be improved by implementing a high temperature heat treatment process. A high temperature heat treatment may be performed for 10 to 60 minutes at a high temperature of 950-1200° C. As described earlier, a tensile stress may be obtained when a plurality of conductive layers 60, 80, and 100 are deposited in deep trenches 30a or 30b. Thus, a wafer may be changed to be concavely warped. However, after a high temperature heat treatment process at 950-1200° C., an amorphous conductive layer 60, 80, and 100 having a tensile stress, may be changed to a crystalline conductive layer 60, 80, and 100 having a compressive stress. Accordingly, on the basis of a high temperature heat treatment process, a wafer that is concavely shaped by a tensile stress may be changed to a convexly shaped wafer. That is, a tensile stress may be reduced. When a high temperature heat treatment process takes too much time, a wafer may become convex again. Therefore, it is desirable to conduct an annealing process within a proper amount of time. In an example, a warpage of a wafer may almost disappear with a heat treatment for 10 to 60 minutes. That is, a tensile stress may be reduced by a high temperature heat treatment. Therefore, a warped wafer may become flat again.

Figure 13:
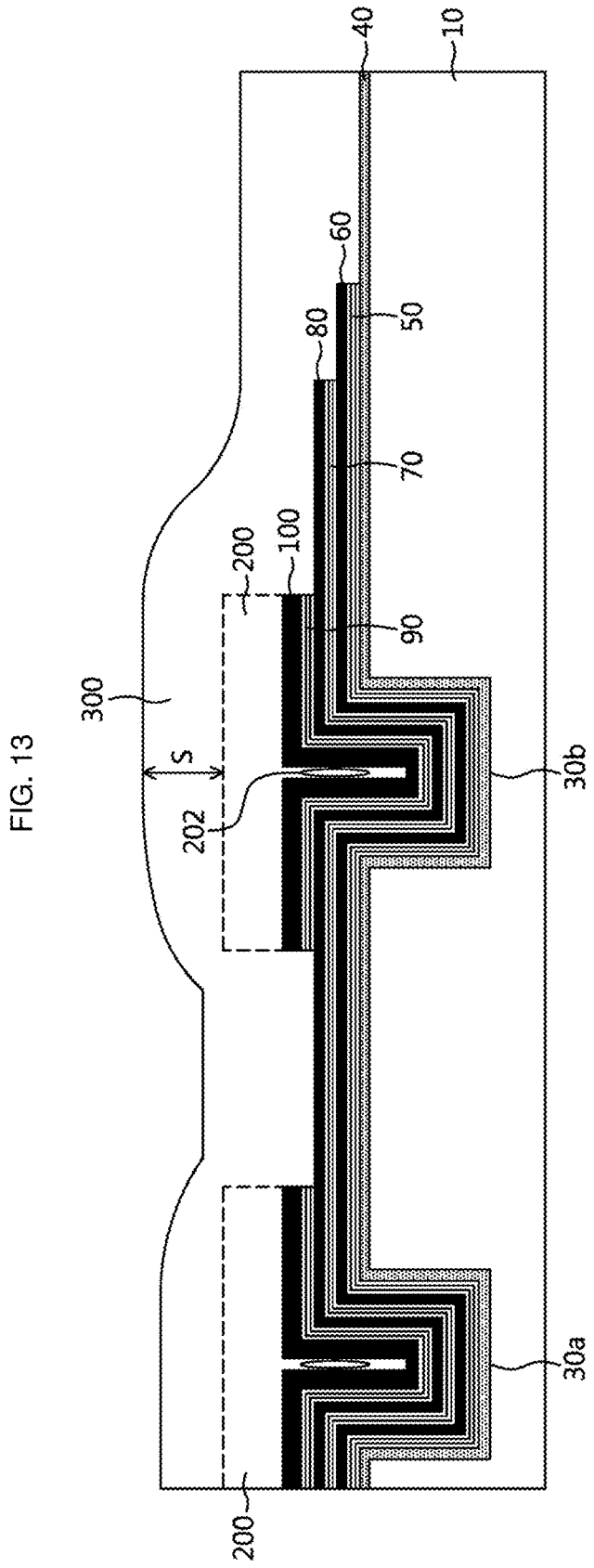

Referring to FIG. 13, an inter-layer insulating film 300 may be formed on the trench capacitor including the patterned gap-fill insulating film 200, the patterned third conductive layer 100 and the patterned third dielectric film 90, the patterned second conductive layer 80 and the patterned second dielectric film 70, the patterned first conductive layer 60 and the patterned first dielectric film 50. Since the patterned gap-fill insulating film 200 may thickly remain on the first trench 30a and the second trench 30b, the inter-layer insulating film 300 may be stacked relatively higher on the first trench 30a and the second trench 30b when a process to deposit the inter-layer insulating film 300 is performed.

When the inter-layer insulating film 300 is deposited, a top surface of the first trench 30a and the second trench 30b may be stacked higher with the inter-layer insulating film 300 than other portions. In an example, the inter-layer insulating film 300 should be planarized to remove contact open defects in a subsequent process, such as, but not limited to, a contact photo process, etc. Therefore, a process to flatten the inter-layer insulating film 300 may be performed by removing at least the inter-layer insulating film 300 that is formed at a higher position, or at a higher height, on the first trench 30a and on the second trench 30b. A thickness 'S' as illustrated in FIG. 13, is a height of the inter-layer insulating film 300 that is to be removed.

Figure 14:
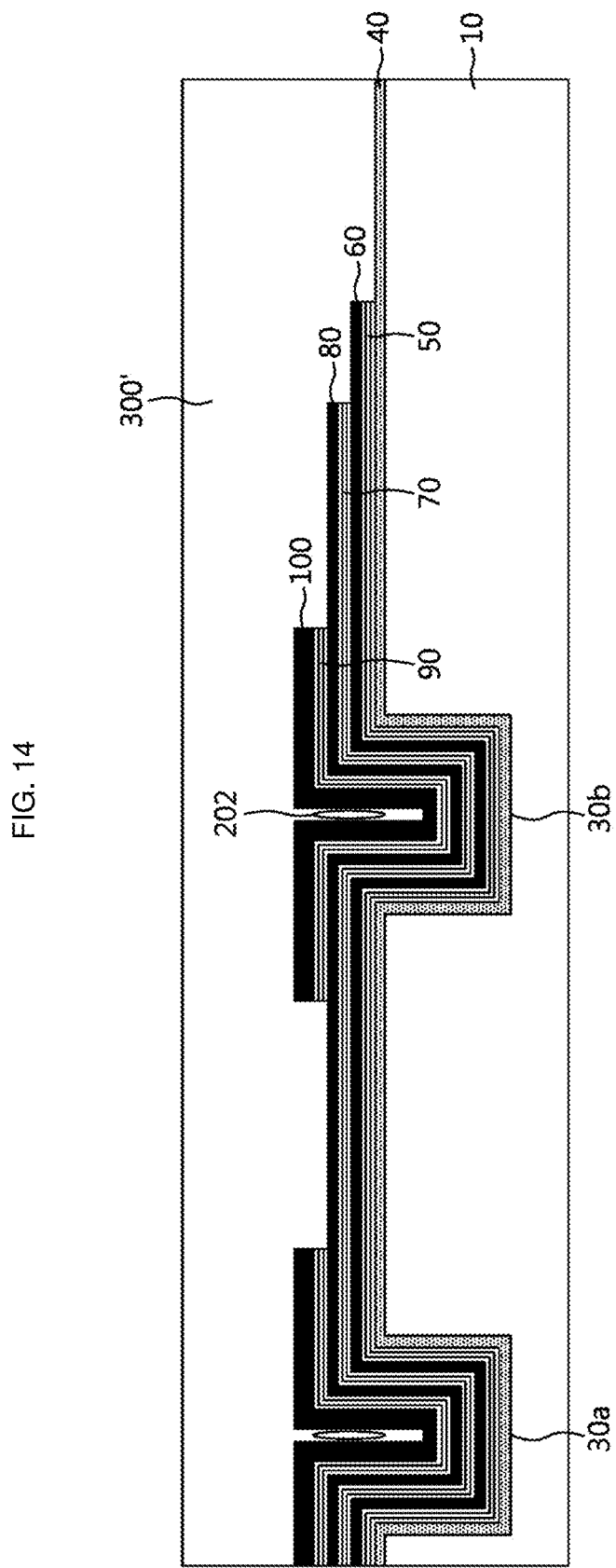

Referring to FIG. 14, a CMP process may be performed to flatten the inter-layer insulating film 300. Specifically, in comparison with FIG. 13, a thickness 'S' of the inter-layer insulating film 300 that is stacked at a greater height in the first trench 30a and the second trench 30b region may be removed, thus entirely flattening the inter-layer insulating film 300 (300').

Figure 15:
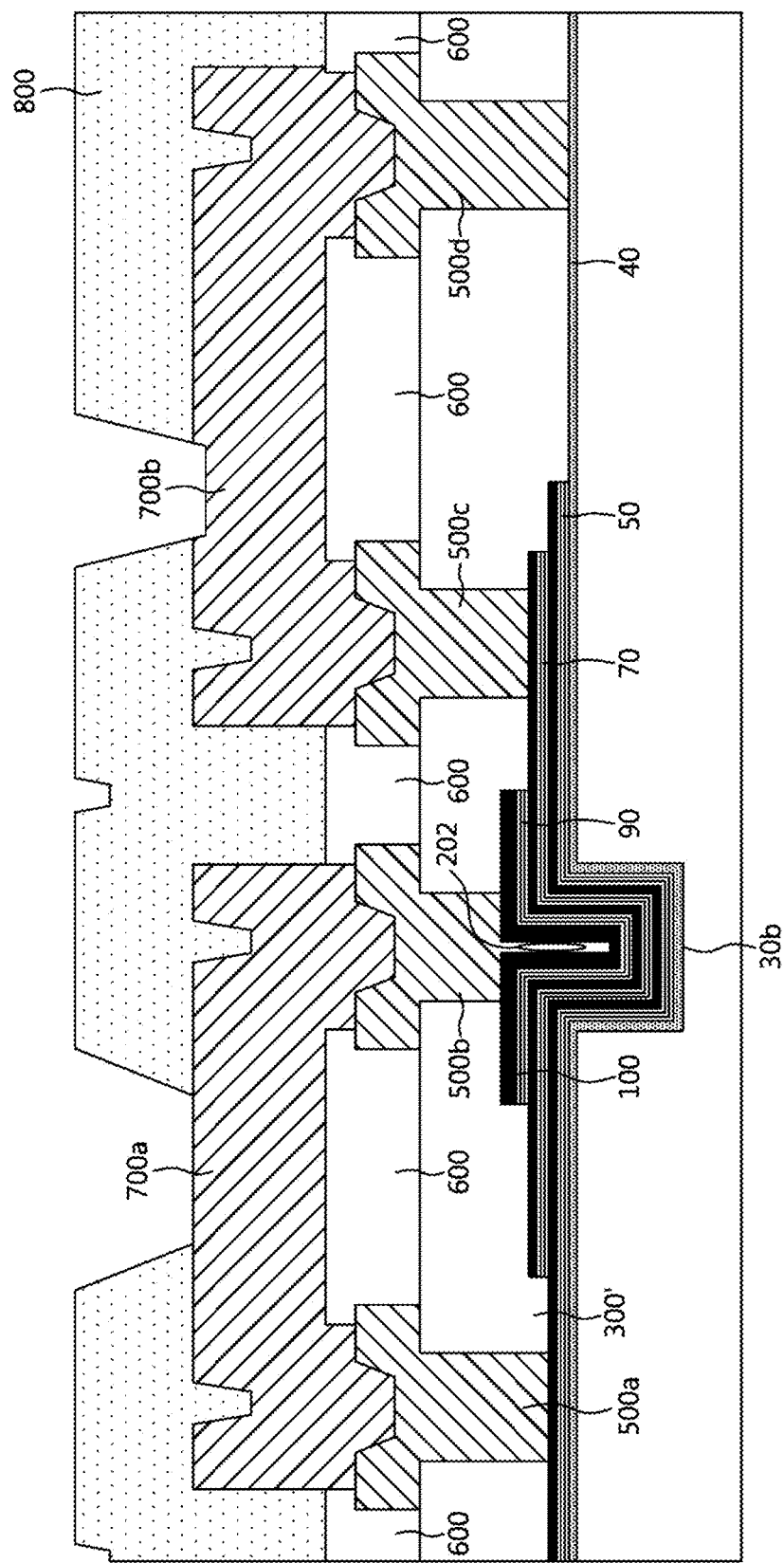

Referring to FIG. 15, a plurality of first level metal interconnects 500a, 500b, 500c, and 500d may be formed between first inter-layer insulating films 300'. To electrically connect the first conductive layer 60 and the third conductive layer 100, a second level metal interconnect 700a may be formed or disposed on a second inter-layer insulating film 600. Additionally, another second level metal interconnect 700b may be formed to electrically connect the second conductive layer 80 and the doping region 40. A capacitor parallel structure may be formed to maximize a capacity of the trench capacitor. Therefore, by connecting the doping region 40 and the second conductive layer 80, and connecting the first conductive layer 60 and the third conductive layer 100, a trench capacitor of a parallel structure may be manufactured.

In one or more examples, when the second conductive layer 80 and the doping region 40 are electrically connected to each other, and the first conductive layer 60 and the third conductive layer 100 are electrically connected to each other, the trench capacitor 120 with a parallel shape may be formed. The trench capacitor 120 may be formed by implementing the second conductive layer 80 and the doping region 40 as a lower electrode, and by implementing the first conductive layer 60 and the third conductive layer 100 as an upper electrode.

Figure 16:
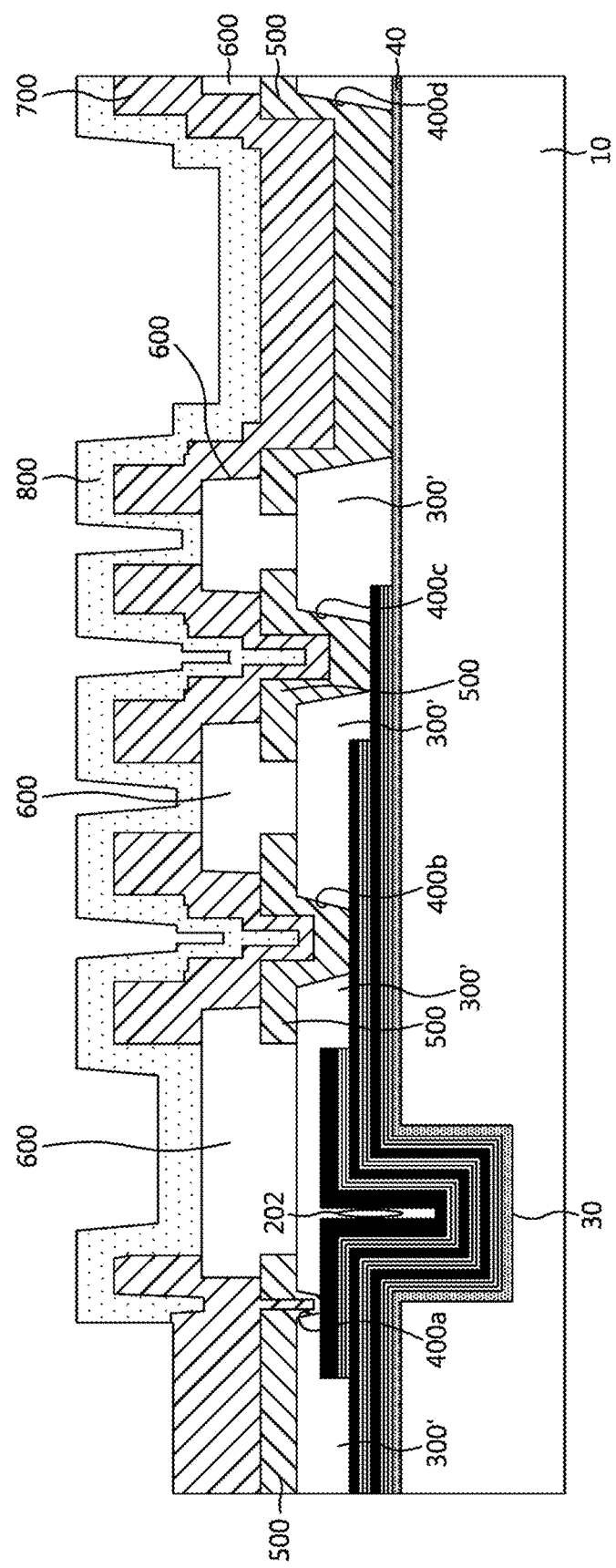
FIG. 16 illustrates an example metal interconnect formed on a trench capacitor structure, in accordance with one or more embodiments.

FIG. 16 illustrates an example metal interconnect formed on a trench capacitor structure, in accordance with one or more embodiments.

Referring to FIG. 16, a plurality of contact holes 400a, 400b, 400c, and 400d may be formed by etching the inter-layer insulating film 300' after a flattening process. A plurality of a first level metal interconnects 500 may be formed to fill the respective contact holes 400a, 400b, 400c, and 400d. Additionally, an inter-layer insulating film 600, which covers a plurality of a first level metal interconnects 500, may be formed. A VIA may be formed by etching the inter-layer insulating film 600, and the second level metal interconnect 700 may be formed to fill an inside portion of the VIA. A passivation film 800 may be formed on the inter-layer insulating film 600 and the plurality of second level metal interconnects 700.

Figure 17:
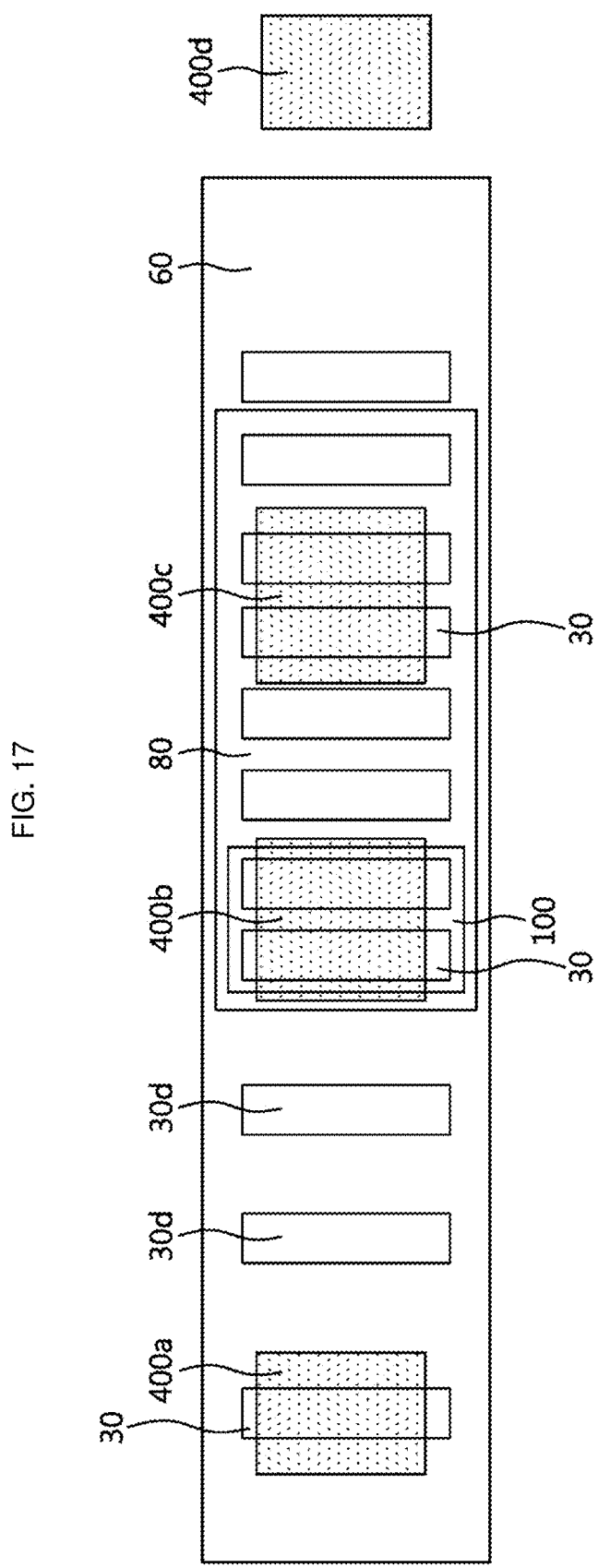
FIGS. 17 to 18 illustrate a plan view of an example trench capacitor structure, in accordance with one or more embodiments.
Figure 18:
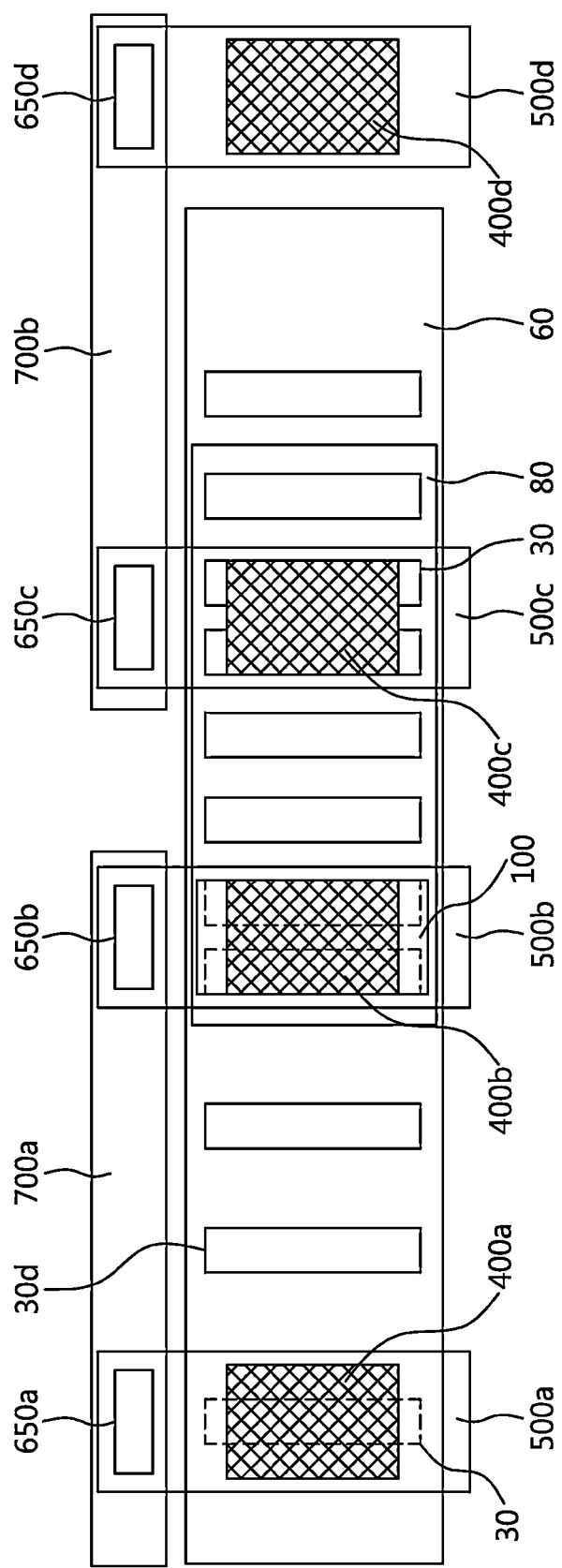

FIGS. 17 and 18 illustrate an example plan view of a trench capacitor structure, in accordance with one or more embodiments.

Referring to FIG. 17, a plurality of deep trenches 30 are disposed on a substrate, and a first conductive layer 60, a second conductive layer 80, and a third conductive layer 100 are disposed on the trench structure. Dummy deep trench 30d may be formed in the substrate 10. The first conductive layer 60 may have a cross-sectional area greater than a cross-sectional area of the second conductive layer 80 in a plan view. The second conductive layer 80 may have a cross-sectional area greater than a cross-sectional area of the third conductive layer 100 in a plan view. The second conductive layer 80 may be overlapped with a portion of the first conductive layer 60. Then, the third conductive layer 100 may be overlapped with a portion of the second conductive layer 80. A plurality of contact regions 400a, 400b, 400c, and 400d may be placed to be respectively connected with the first conductive layer 60, the second conductive layer 80, the third conductive layer 100, and the substrate 10 (or the doping region 40).

Referring to FIG. 18, a plurality of first level metal interconnects 500a, 500b, 500c, and 500d may be respectively placed on the plurality of contact regions 400a, 400b, 400c, and 400d. Thus, the respective first, second, and third conductive layers 60, 80, and 100 may be respectively connected with one of first level metal interconnects 500a, 500b, 500c.

A plurality of VIAs 650a, 650b, 650c, and 650d respectively connected with the plurality of first level metal interconnects 500a, 500b, 500c, and 500d may be formed. Additionally, a plurality of second level metal interconnects 700a and 700b, which may be respectively connected with the plurality of VIAs 650a, 650b, 650c, and 650d, may be formed. The first conductive layer 60 may be electrically connected with the third conductive layer 100, and they may be connected through contact regions 400a and 400b, first level metal interconnects 500a and 500b, first VIAs 650a and 650b, and a second level metal interconnect 700a. A second conductive layer 80 may be electrically connected with a doping region 40 formed inside a substrate 10, and they may be connected through contact regions 400c and 400d, first level metal interconnects 500c and 500d, first VIAs 650c and 650d, and a second level metal interconnect 700b.

According to the examples, a high temperature heat treatment process may be performed in a predetermined condition after gap-filling a first to a third conductive layer in a deep trench. Since a stress of a conductive layer may be minimized by a change of a conductive layer in crystallinity, a warpage of a wafer that occurred in a depositing process of a deep trench may be ultimately improved.

According to the examples, a capacity of a trench capacitor may be maximized because a trench may be deeply formed in a substrate, and since an adhering operation of a wafer is improved by an improvement of a warpage, a device may be manufactured much stably than in typical examples.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A deep trench capacitor, comprising:
    a first deep trench and a second deep trench disposed in a substrate;
    a first dielectric layer, a first conductive layer, and a second dielectric layer disposed on the first deep trench and the second deep trench, respectively;
    a first upper electrode disposed on the second dielectric layer in the first deep trench;
    a second upper electrode disposed on the second dielectric layer in the second deep trench and spaced apart from the first upper electrode;
    a first gap-fill insulating film disposed on the first upper electrode, wherein a first void is formed in the first deep trench;
    a second gap-fill insulating film disposed on the second upper electrode and spaced apart from the first gap-fill insulating film, wherein a second void is formed in the second deep trench;
    a first inter-layer insulating film disposed on the first gap-fill insulating film and the second gap-fill insulating film;
    first level metal interconnects disposed on the first inter-layer insulating film;
    a second inter-layer insulating film disposed on the first inter-layer insulating film; and
    second level metal interconnects disposed on the second inter-layer insulating film.

2. The deep trench capacitor of claim 1, wherein a side surface of the first upper electrode is aligned with a side surface of the first gap-fill insulating film, and
    wherein a side surface of the second upper electrode is aligned with a side surface of the second gap-fill insulating film.

3. The deep trench capacitor of claim 1, further comprising:
    a second conductive layer disposed on the second dielectric layer;
    a first upper dielectric layer disposed between the second conductive layer and the first upper electrode disposed on the first deep trench; and
    a second upper dielectric layer disposed between the second conductive layer and the second upper electrode disposed on the second deep trench, wherein the second upper dielectric layer is spaced apart from the first upper dielectric layer.

4. The deep trench capacitor of claim 1, wherein one of the first level metal interconnects contacts the first upper electrode and overlaps the first void formed in the first deep trench, and wherein the other of the first level metal interconnects contacts the first conductive layer.

5. The deep trench capacitor of claim 1, wherein a portion of the first void is disposed above a top surface of the substrate.

6. The deep trench capacitor of claim 1, further comprising:

a doping region disposed below the first void and the second void, the doping region disposed in the substrate, wherein each side surface of the first upper electrode and the second upper electrode contacts the first inter-layer insulating film.

7. The deep trench capacitor of claim 3, wherein the first upper electrode has a thickness greater than a thickness of the first conductive layer or the second conductive layer, wherein the first dielectric layer and the second dielectric layer comprise a first oxide layer, a nitride layer, and a second oxide layer, respectively, and wherein the first conductive layer, the second conductive layer, the first upper electrode, and the second upper electrode comprise a poly-silicon material.

8. A deep trench capacitor, comprising:

a first deep trench and a second deep trench disposed in a substrate;

a first dielectric layer, a first conductive layer, and a second dielectric layer, disposed on the first and second deep trenches, respectively;

a first upper electrode and a second upper electrode disposed on the second dielectric layer and disposed on the first and second deep trenches, respectively;

a first gap-fill insulating film and a second gap-fill insulating film spaced apart from each other and disposed on the first and second deep trenches, respectively, wherein a first void and a second void are formed in the first gap-fill insulating film and the second gap-fill insulating film, respectively;

a first inter-layer insulating film disposed on the first gap-fill insulating film and the second gap-fill insulating film; and first level metal interconnects disposed on the first inter-layer insulating film.

9. The deep trench capacitor of claim 8, wherein a side surface of the first upper electrode is aligned with a side surface of the first gap-fill insulating film, and wherein a side surface of the second upper electrode is aligned with a side surface of the second gap-fill insulating film.

10. The deep trench capacitor of claim 8, further comprising:

a second conductive layer disposed on the second dielectric layer;

a first upper dielectric layer disposed between the second conductive layer and the first upper electrode disposed on the first deep trench; and a second upper dielectric layer disposed between the second conductive layer and the second upper electrode disposed on the second deep trench, wherein the second upper dielectric layer is spaced apart from the first upper dielectric layer.

11. The deep trench capacitor of claim 8, wherein one of the first level metal interconnects contacts the first upper electrode and overlaps the first void formed in the first deep trench, and wherein the other of the first level metal interconnects contacts the first conductive layer.

* * * * *